(12) United States Patent
Lin

(10) Patent No.: US 8,344,821 B2
(45) Date of Patent: Jan. 1, 2013

(54) DIFFERENTIAL TRANSMISSION LINE PRINTED CIRCUIT BOARD LAYOUT BASED ON EYE DIAGRAM PARAMETERS

(75) Inventor: Yu-Hsu Lin, Santa Clara, CA (US)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 189 days.

(21) Appl. No.: 12/856,544

(22) Filed: Aug. 13, 2010

(65) Prior Publication Data
US 2011/0273240 A1   Nov. 10, 2011

(30) Foreign Application Priority Data
May 5, 2010  (CN) .......................... 2010 1 0162565

(51) Int. Cl.
*H01P 3/08* (2006.01)
(52) U.S. Cl. ................................ 333/4; 333/5
(58) Field of Classification Search .................. 333/1, 4, 333/5
See application file for complete search history.

(56) References Cited

U.S. PATENT DOCUMENTS 5,027,088 A * 6/1991 Shimizu et al. .................... 333/1
6,677,831 B1 * 1/2004 Cheng et al. .................... 333/34

* cited by examiner

*Primary Examiner* — Benny Lee
(74) *Attorney, Agent, or Firm* — Altis Law Group, Inc.

(57) ABSTRACT

A printed circuit board layout method includes the following steps. A printed circuit board with a signal layer and a pair of differential transmission lines positioned on the signal layer is provided. A first distance is determined; when the distance between the pair of differential transmission lines is greater than the first distance, an eye width and an eye height of an eye diagram nearly remains the same. When a distance between the pair of differential transmission lines is less than the first distance, an eye width and an eye height of an eye diagram decreases. A second distance that is less than the first distance is set between the pair of differential transmission lines which makes the eye width and the eye height greater than a predetermined value, and which is determined by a Far End Crosstalk (FEXT) on the eye diagram when the pair differential transmission lines transmit signals.

9 Claims, 7 Drawing Sheets

DIFFERENTIAL TRANSMISSION LINE PRINTED CIRCUIT BOARD LAYOUT BASED ON EYE DIAGRAM PARAMETERS

BACKGROUND

1. Technical Field

The present disclosure relates to printed circuit boards and specifically to a printed circuit board and a layout method thereof that can save layout space on the printed circuit board.

2. Description of Related Art

Printed circuit boards are designed for coupling control chips and electronic devices, to transmit signals such as high-speed differential signals. Mutual capacitance may be generated between two conductors if the two conductors are in close proximity with each other.

Crosstalk is the electrical "noise" caused by mutual inductance and mutual capacitance between signal conductors, due to the close proximity of the signal conductors to each other. Crosstalk can cause digital system failure due to false signals appearing on a receiver. A typical layout method for reducing the crosstalk is to increase the distance between the two conductors, which occupies extra space and increases the cost.

DETAILED DESCRIPTION OF THE INVENTION

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
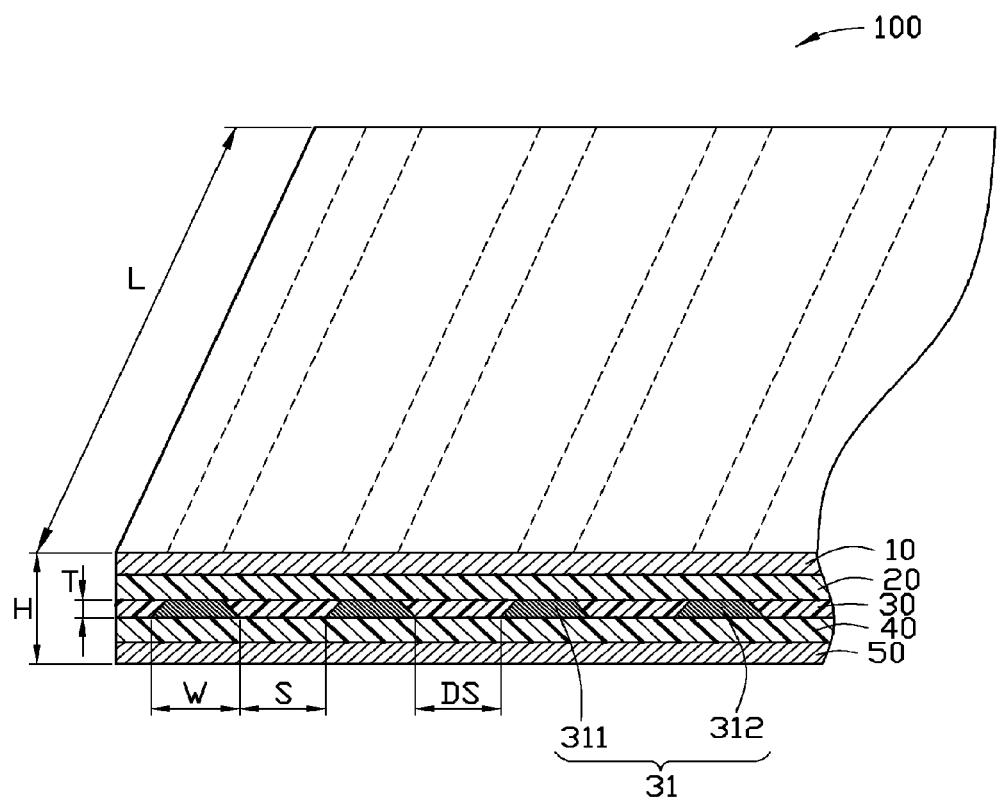
FIG. 1 is an isometric view of an embodiment of a printed circuit board with at least one pair of differential transmission lines.

Referring to FIG. 1, a printed circuit board 100 includes a first reference layer 10, a first dielectric layer 20, a signal layer 30, a second dielectric layer 40 and a second reference layer 50 arrayed in sequence from top to bottom. The signal layer 30 includes at least a pair of differential transmission lines 31 thereon. Each differential transmission line 31 includes a first transmission line 311 and a second transmission line 312 which are strip lines. A plurality of dielectric material is disposed between each adjacent first and second transmission lines 311 and 312. A width of each of the first and second transmission lines 311 and 312 is W. A thickness of each of the first and second transmission lines 311 and 312 is T. A length of each of the first and second transmission lines 311 and 312 is L. A distance between the first and second transmission lines 311 and 312 is S. A distance between a middle of the two differential transmission lines 31 is DS. A thickness of the first and second dielectric layers 20 and 40 and the signal layer 30 is H. A thickness of the first dielectric layer 20 is equal to that of the second dielectric layer 40. In one embodiment, W is 4 mil, T is 1.2 mil, L is 12 inch, S is 8 mil, and H is 13.2 mil. A dielectric constant of the first and second dielectric layers 20 and 40 is 4.1. The distance S is a fixed value, which is determined by W, T, H, and the dielectric constant of the first and second dielectric layers 20 and 40. The input terminals of each differential transmission line 31 are electrically connected to a signal generator (not shown). The output terminals of each differential transmission line 31 are electrically connected to an oscillograph (not shown). In one embodiment, a data transfer rate of the signal generator is 5.2 bit per second; the error rate of the oscillograph is 1E-12 ($1\times10^{-12}$).

Figure 2:
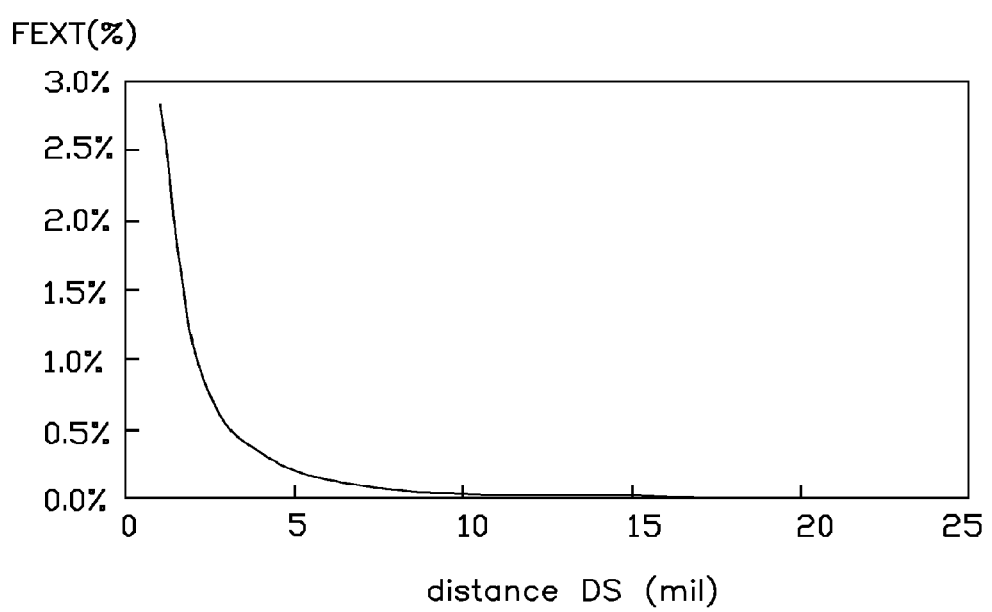
FIG. 2 is an isometric view of an embodiment showing a signal waveform of a relationship between the differential transmission lines distance and Far End Crosstalk (FEXT) using lossless differential transmission lines.
Figure 3:
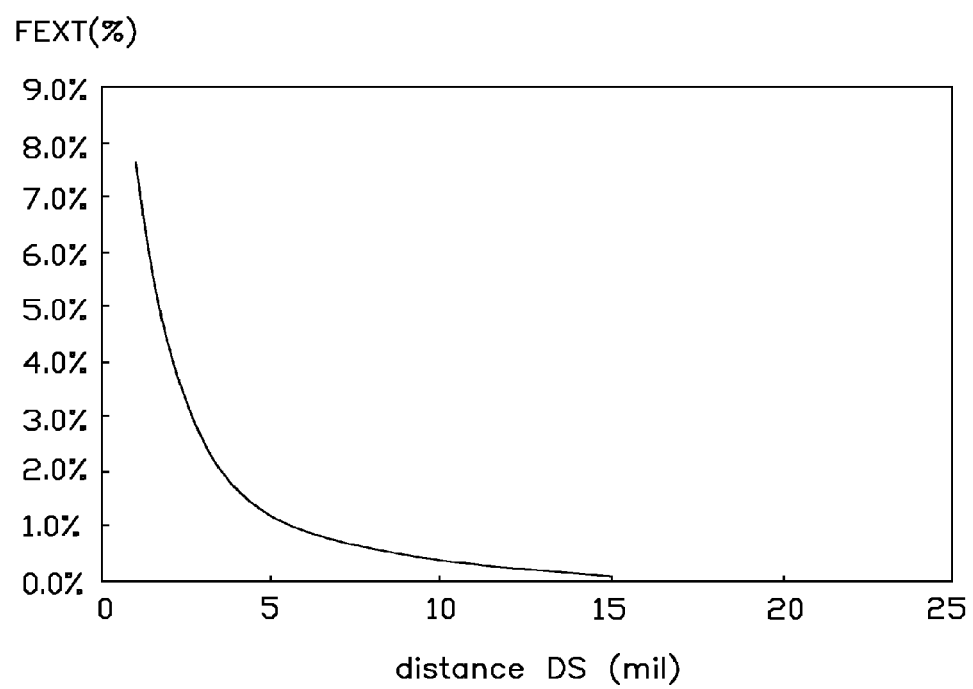
FIG. 3 is an isometric view of an embodiment showing a signal waveform of a relationship between the differential transmission lines distance and FEXT using lossy differential transmission lines.

Referring to FIGS. 2 and 3, the output terminals of each differential transmission line 31 are electrically connected to a load (not shown) of 50 ohm. As shown in FIG. 2, when the distance DS in mils is greater than 10 mil, the FEXT % approaches zero. Additionally, when the distance DS is less than 10 mil, the FEXT % increases quickly. As shown in FIG. 3, when the distance DS in mils is greater than 15 mil, the FEXT % approaches zero. Additionally, when the distance DS is less than 15 mil, the FEXT % increases quickly. When the distance DS is 10 mil, the FEXT % is 0.34% which also meets requirement of the pair differential transmission lines 31. In one embodiment, a loss tangent of the pair differential transmission lines 31 is 0.02 in FIG. 3.

Figure 4:
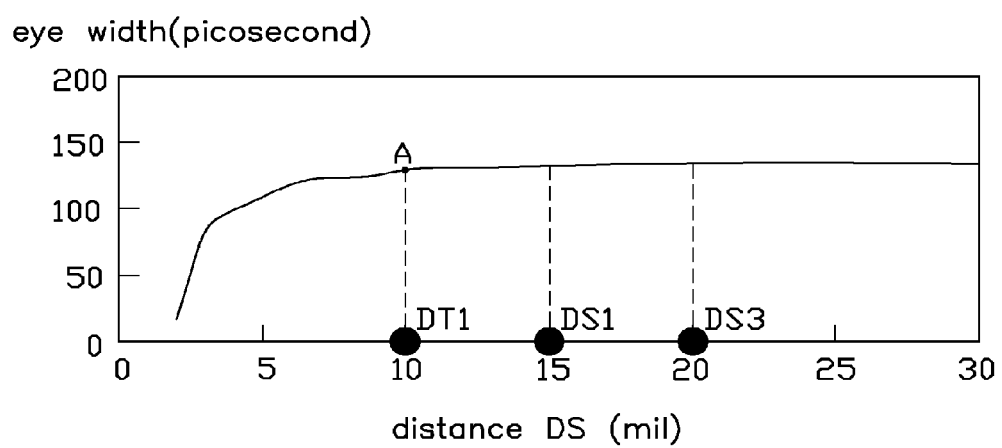
FIG. 4 is an oscillographic trace showing a signal waveform of a relationship between the differential transmission lines distance and eye width in eye diagram, in accordance with an embodiment.
Figure 5:
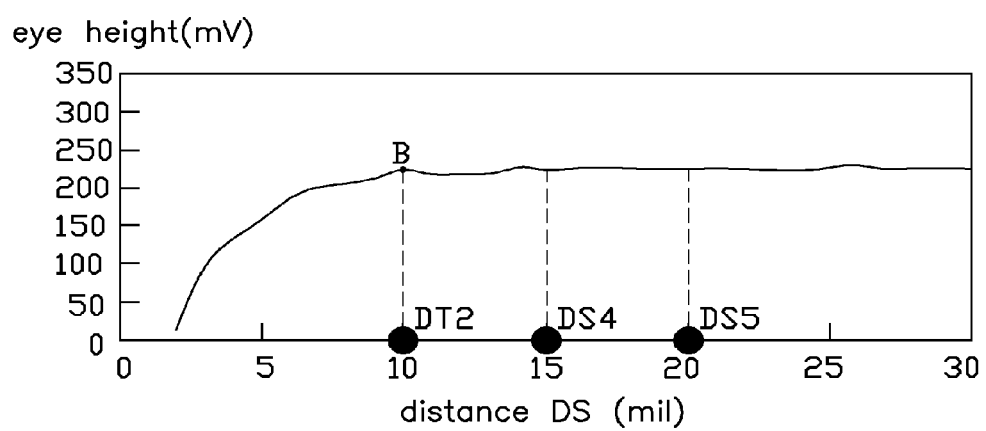
FIG. 5 is an oscillographic trace showing a signal waveform of a relationship between the differential transmission lines distance and eye height in eye diagram, in accordance with an embodiment.

Referring to FIGS. 4 and 5, in simulation, to obtain a signal waveform of relationship between the distance DS in mils and the eye width in picosecond in the eye diagram as shown in FIG. 4, the distance DS is changed. In addition, a signal waveform of a relationship between the distance DS in mils and the eye height in mv in the eye diagram as shown in FIG. 5. Referring to FIG. 4, the distance DS is capable of being set to a first distance DS1 which makes an eye width of the eye diagram achieve a maximum value. When the distance DS is greater than the first distance DS1, an eye width of the eye diagram nearly remains the same. Additionally, when the distance DS is less than the first distance DS1, an eye width of the eye diagram decreases. The distance DS is further capable of being set to a third distance DS3 that is greater than the first distance DS1, which corresponds to an eye width equal to the eye width that corresponds to the first distance DS1. In one embodiment, the first distance DS1 is 15 mil and the third distance DS3 is 20 mil.

The signal waveform is a tangent curve which has a first threshold point A. The first threshold point A corresponds to a first threshold distance DT1 of the distance DS. An eye width of the eye diagram that corresponds to where the first threshold point A is greater than a predetermined value, and which is determined by the FEXT on the eye diagram when the differential transmission lines 31 transmit signals. Eye widths of the eye diagram that correspond to the other points on left side of the first threshold point A is less than the predetermined value. In one embodiment, the first threshold distance DT1 is 10 mil. Therefore, the distance DS is set as a second distance that is greater than or equal to the first threshold distance DT1 and less than or equal to the first distance DS1. In a typical layout method, the distance DS increases to the third distance DS3 to increase the eye width. The simulation according to the set conditions shows that the layout space can be saved when the distance DS is set as the second distance. For example, when the first threshold distance DT1 is set as the distance DS, a 10 mil layout space can be saved.

Referring to FIG. 5, the distance DS is further capable of being set to a fourth distance DS4 which makes an eye height of the eye diagram to reach a maximum value. When the distance DS is greater than the fourth distance DS4, an eye height of the eye diagram nearly remains the same. Additionally, when the distance DS is less than the fourth distance DS4, an eye height of the eye diagram decreases. The distance DS is also capable of being set to a fifth distance DS5 that is greater than the fourth distance DS4, which corresponds to an eye height equal to the eye height that corresponds to the fourth distance DS4. In one embodiment, the fourth distance DS4 is 15 mil and the fifth distance DS5 is 20 mil.

The signal waveform has a second threshold point B. The second threshold point B corresponds to a second threshold distance DT2 of the distance DS. An eye height of the eye diagram that corresponds to where the second threshold point B is greater than the predetermined value. Eye heights of the eye diagram that correspond to the other points on left side of the second threshold point B is less than the predetermined value. In one embodiment, the second threshold distance DT2 is 10 mil. Therefore, the distance DS is set as a second distance that is greater than or equal to the second threshold distance DT2 and less than or equal to the fourth distance DS4. In a typical layout method, the distance DS increases to the fifth distance DS5 to increase the eye height. The simulation according to the set conditions shows that the layout space can be saved when the distance DS is set as the second distance. For example, when the second threshold distance DT2 is set as the distance DS, a 10 mil layout space can be saved.

Usually a second distance that corresponds to the eye width is equal to that of the eye height. When an eye width second distance is not equal to an eye height second distance, the greater one of the eye width and eye height second distances is set as the second distance.

Figure 6:
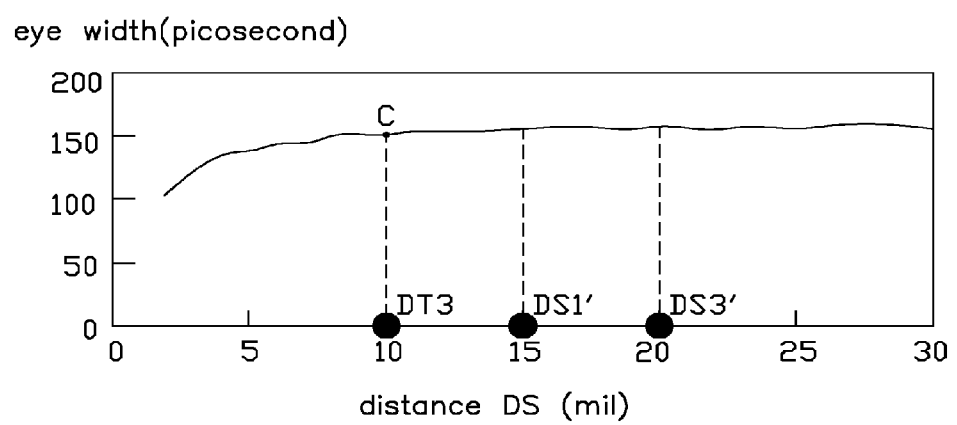
FIG. 6 is an oscillographic trace showing a signal waveform of a relationship between the differential transmission lines distance and eye width in eye diagram, in accordance with another embodiment.
Figure 7:
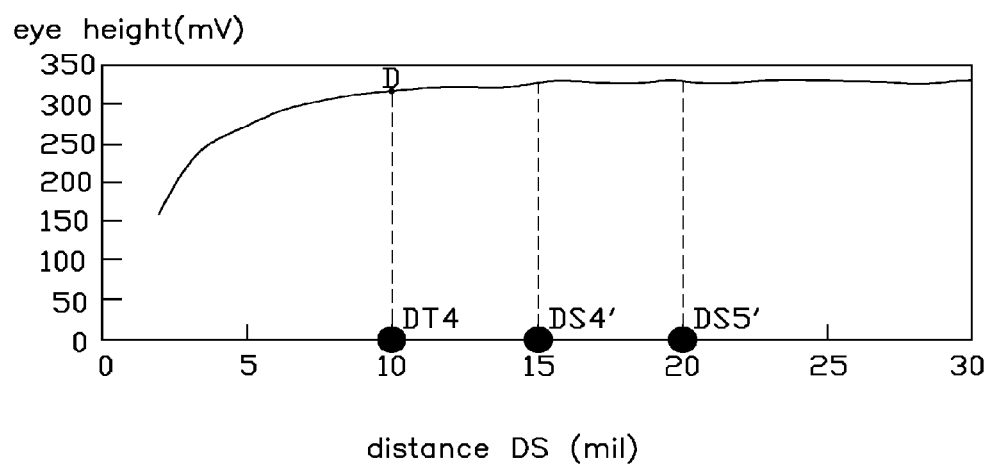
FIG. 7 is an oscillographic trace showing a signal waveform of a relationship between the differential transmission lines distance and eye height in eye diagram, in accordance with another embodiment.

In another embodiment, W is 4 mil, T is 1.2 mil, L is 12 inch, S is 8 mil, and H is 13.2 mil. A dielectric constant of the first and second dielectric layers 20 and 40 is 4.1. The first and second transmission lines 311 and 312 of each differential transmission line are pre-emphasized to reduce noise signals and increase eye widths and eye height of the eye diagram. Referring to FIGS. 6 and 7, in simulation, to obtain a signal waveform of relationship between the distance DS in mils and the eye width in picosecond in the eye diagram as shown in FIG. 6, the distance DS is changed. In addition, as shown in FIG. 7 a signal waveform of relationship between the distance DS in mils and the eye height in mv in the eye diagram. Referring to FIG. 6, the distance DS is capable of being set to a first distance DS1' which makes an eye width of the eye diagram achieve a maximum value. When the distance DS is greater than the first distance DS 1', an eye width of the eye diagram nearly remains the same. Additionally, when the distance DS is less than the first distance DS1', an eye width of the eye diagram decreases. The distance DS is further capable of being set to a third distance DS3' that is greater than the first distance DS1', which corresponds to an eye width equal to the eye width that corresponds to the first distance DS1'. In one embodiment, the first distance DS1' is 15 mil and the third distance DS3' is 20 mil.

The signal waveform has a third threshold point C. The third threshold point C corresponds to a third threshold distance DT3 of the distance DS. An eye width of the eye diagram that corresponds to where the third threshold point C is greater than a predetermined value, and which is determined by the FEXT on the eye diagram when the differential transmission lines 31 transmit signals. Eye widths of the eye diagram that correspond to the other points on left side of the third threshold point C is less than the predetermined value. In one embodiment, the third threshold distance DT3 is 10 mil. Therefore, the distance DS is set as a second distance that is greater than or equal to the third threshold distance DT3 and less than or equal to the first distance DS1'. In a typical layout method, the distance DS increases to the third distance DS3' to increase the eye width. The simulation according to the set conditions shows that the layout space can be saved when the distance DS is set as the second distance. For example, when the third threshold distance DT3 is set as the distance DS, a 10 mil layout space can be saved.

Referring to FIG. 7, the distance DS is further capable of being set to a fourth distance DS4' which makes an eye height of the eye diagram achieve a maximum value. When the distance DS is greater than the fourth distance DS4', an eye height of the eye diagram nearly remains the same. Additionally, when the distance DS is less than the fourth distance DS4', an eye height of the eye diagram decreases. The distance DS is also capable of being set to a fifth distance DS5' that is greater than the fourth distance DS4', which corresponds to an eye height equal to the eye height that corresponds to the fourth distance DS4'. In one embodiment, the fourth distance DS4' is 15 mil and the fifth distance DS5' is 20 mil.

The signal waveform has a fourth threshold point D. The fourth threshold point D corresponds to a fourth threshold distance DT4 of the distance DS. An eye height of the eye diagram that corresponds to where the fourth threshold point D is greater than the predetermined value. Eye heights of the eye diagram that correspond to the other points on left side of the fourth threshold point D is less than the predetermined value. In one embodiment, the fourth threshold distance DT4 is 10 mil. Therefore, the distance DS is set as a second distance that is greater than or equal to the fourth threshold distance DT4 and less than or equal to the fourth distance DS4'. In a typical layout method, the distance DS increases to the fifth distance DS5' to increase the eye height. The simulation according to the set conditions shows that the layout space can be saved when the distance DS is set as the second distance. For example, when the fourth threshold distance DT4 is set as the distance DS, a 10 mil layout space can be saved. The simulation according to the set conditions shows that the layout space can be saved when the distance DS is set as the second distance. For example, when the fourth threshold distance DT4 is set as the distance DS, a 10 mil layout space can be saved.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board layout method comprising:
providing a printed circuit board comprising a signal layer and a pair of differential transmission lines positioned on the signal layer;
determining a first distance; wherein when a distance between the pair of differential transmission lines is greater than the first distance, an eye width and an eye height of an eye diagram obtained at output terminals of the pair of differential transmission lines are substantially constant values; when the distance between the pair of differential transmission lines is less than the first distance, the eye width and the eye height of the eye diagram obtained at the output terminals of the pair of differential transmission lines are decreased from the constant values;
determining a predetermined value, on the eye diagram obtained from transmit signals on the pair of differential transmission lines, when a percentage of a Far End Crosstalk (FEXT%) is approximately zero;
setting a second distance shorter than the first distance, as the distance between the pair of differential transmission lines when the eye width and the eye height obtained at the output terminals are decreased from the constant values; and
repeating setting the second distance until the eye width and the eye height are greater than the predetermined value.

2. The method of claim 1, wherein setting the second distance comprises the following steps: comparing an eye width second distance, that corresponds to the eye width, with an eye height second distance, that corresponds to the eye height; and setting the greater one of the eye width and eye height second distances as the second distance.

3. The method of claim 1, wherein determining the first distance comprises the following steps: obtaining a signal waveform of relationship between the differential transmission lines distance and the eye width or the eye height in the eye diagram; and determining the minimum differential transmission lines distance that corresponds to the maximum eye width or eye height as the first distance between the pair of differential transmission lines.

4. The method of claim 3, wherein when a distance between the pair of differential transmission lines on the signal waveform is greater than the second distance, the eye width and the eye height of the eye diagram increases; and when a distance between the pair of differential transmission lines on the signal waveform is less than the second distance, the eye width and the eye height of the eye diagram decreases.

5. The method of claim 3, wherein obtaining the signal waveform comprises the following steps: coupling the input terminals of the pair of differential transmission lines to a signal generator and the output terminals of the pair of differential transmission lines to an oscillograph; generating signals of fixed frequency by the signal generator; and obtaining the signal waveform of the eye diagram on the oscillograph.

6. A printed circuit board comprising:
a signal layer comprising a pair of differential transmission lines thereon; an eye width and an eye height of an eye diagram obtained at output terminals of the pair of differential transmission lines is variable according to a distance between the pair of differential transmission lines;
wherein when the distance between the pair of differential transmission lines is a first distance, the eye width and the eye height of the eye diagram reaches maximum values; a second distance shorter than the first distance, is set as the distance between the pair of differential transmission lines when the eye width and the eye height obtained at the output terminals are decreased from the maximum values; and the eye width and the eye height are greater than a predetermined value when the second distance is set as the distance between the pair of differential transmission lines; wherein the predetermined value is determined on the eye diagram obtained from transmit signals on the pair of differential transmission lines, when a percentage of a FEXT (FEXT%) is approximately zero.

7. The printed circuit board of claim 6, wherein when an eye width second distance that corresponds to the eye width is not equal to an eye height second distance that corresponds to the eye height, a greater one of the eye width second distance and the eye height second distance is set as the second distance.

8. The printed circuit board of claim 6, further comprising a first reference layer and a first dielectric layer arrayed above the signal layer, and a second dielectric layer and a second reference layer arrayed below the signal layer in sequence from top to bottom; and a thickness of the first dielectric layer is equal to a thickness of the second dielectric layer.

9. The printed circuit board of claim 8, wherein each differential transmission line includes a first transmission line and a second transmission line; and the first and second transmission lines are strip lines.

* * * * *